US011862592B2

(12) United States Patent
Kalnitsky et al.

(10) Patent No.: US 11,862,592 B2
(45) Date of Patent: Jan. 2, 2024

(54) SIDEWALL SPACER TO REDUCE BOND PAD NECKING AND/OR REDISTRIBUTION LAYER NECKING

(71) Applicant: Taiwan Semiconductor Manufacturing Company, Ltd., Hsin-Chu (TW)

(72) Inventors: Alexander Kalnitsky, San Francisco, CA (US); Kong-Beng Thei, Pao-Shan Village (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/869,850

(22) Filed: Jul. 21, 2022

(65) Prior Publication Data

US 2022/0359443 A1 Nov. 10, 2022

Related U.S. Application Data

(63) Continuation of application No. 17/117,665, filed on Dec. 10, 2020, now Pat. No. 11,476,214, which is a
(Continued)

(51) Int. Cl.
*H01L 23/00* (2006.01)
*H01L 23/31* (2006.01)
(Continued)

(52) U.S. Cl.
CPC .............. *H01L 24/08* (2013.01); *H01L 21/56* (2013.01); *H01L 21/76829* (2013.01);
(Continued)

(58) Field of Classification Search
CPC ... H01L 24/08; H01L 21/56; H01L 21/76829; H01L 23/3171; H01L 23/5226;
(Continued)

(56) References Cited

U.S. PATENT DOCUMENTS 6,040,243 A  3/2000 Li et al.
6,590,295 B1  7/2003 Liao et al.
(Continued)

FOREIGN PATENT DOCUMENTS

TW  530381 B  5/2003

OTHER PUBLICATIONS

Non-Final Office Action dated May 11, 2020 for U.S. Appl. No. 16/416,614.
(Continued)

*Primary Examiner* — Tong-Ho Kim
(74) *Attorney, Agent, or Firm* — Eschweiler & Potashnik, LLC

(57) ABSTRACT

In some embodiments, an integrated chip (IC) is provided. The IC includes a metallization structure disposed over a semiconductor substrate, where the metallization structure includes an interconnect structure disposed in an interlayer dielectric (ILD) structure. A passivation layer is disposed over the metallization structure, where an upper surface of the interconnect structure is at least partially disposed between opposite inner sidewalls of the passivation layer. A sidewall spacer is disposed along the opposite inner sidewalls of the passivation layer, where the sidewall spacer has rounded sidewalls. A conductive structure is disposed on the passivation layer, the rounded sidewalls of the sidewall spacer, and the upper surface of the interconnect structure.

20 Claims, 9 Drawing Sheets

Related U.S. Application Data continuation of application No. 16/416,614, filed on May 20, 2019, now Pat. No. 10,879,200.

(60) Provisional application No. 62/753,536, filed on Oct. 31, 2018.

(51) Int. Cl.
  *H01L 23/522* (2006.01)
  *H01L 23/528* (2006.01)
  *H01L 21/56* (2006.01)
  *H01L 21/768* (2006.01)

(52) U.S. Cl.
  CPC ...... *H01L 23/3171* (2013.01); *H01L 23/5226* (2013.01); *H01L 23/5283* (2013.01); *H01L 2224/0231* (2013.01); *H01L 2224/02373* (2013.01); *H01L 2224/02375* (2013.01); *H01L 2224/02381* (2013.01)

(58) Field of Classification Search
  CPC ......... H01L 23/5283; H01L 2224/0231; H01L 2224/02373; H01L 2224/02375; H01L 2224/02381; H01L 24/11; H01L 24/13; H01L 24/45; H01L 2224/02126; H01L 2224/0345; H01L 2224/03452; H01L 2224/03462; H01L 2224/03464; H01L 2224/0362; H01L 2224/03622; H01L 2224/0381; H01L 2224/03831; H01L 2224/0401; H01L 2224/04042; H01L 2224/05548; H01L 2224/05558; H01L 2224/05572; H01L 2224/05624; H01L 2224/05647; H01L 2224/1145; H01L 2224/11452; H01L 2224/11462; H01L 2224/11464; H01L 2224/11849; H01L 2224/131; H01L 2224/13147; H01L 2224/45147; H01L 23/3192; H01L 24/03; H01L 24/05; H01L 23/3157; H01L 23/4824; H01L 23/481; H01L 2224/02331
  USPC ....................................................... 257/734
  See application file for complete search history.

(56) References Cited

U.S. PATENT DOCUMENTS

| | | | |
|---|---|---|---|
| 10,879,200 B2* | 12/2020 | Kalnitsky | ........... H01L 23/3192 |
| 11,476,214 B2* | 10/2022 | Kalnitsky | ........... H01L 23/3192 |
| 2004/0227247 A1 | 11/2004 | Chooi et al. | |
| 2012/0028458 A1 | 2/2012 | Cabral, Jr. et al. | |
| 2012/0126405 A1 | 5/2012 | Daubenspeck et al. | |
| 2017/0125664 A1 | 5/2017 | Tahmasebi et al. | |

OTHER PUBLICATIONS

Final Office Action dated Aug. 19, 2020 for U.S. Appl. No. 16/416,614.

Notice of Allowance dated Oct. 23, 2020 for U.S. Appl. No. 16/416,614.

Non-Final Office Action dated Apr. 22, 2022 for U.S. Appl. No. 17/117,665.

Notice of Allowance dated Jun. 13, 2022 for U.S. Appl. No. 17/117,665.

* cited by examiner

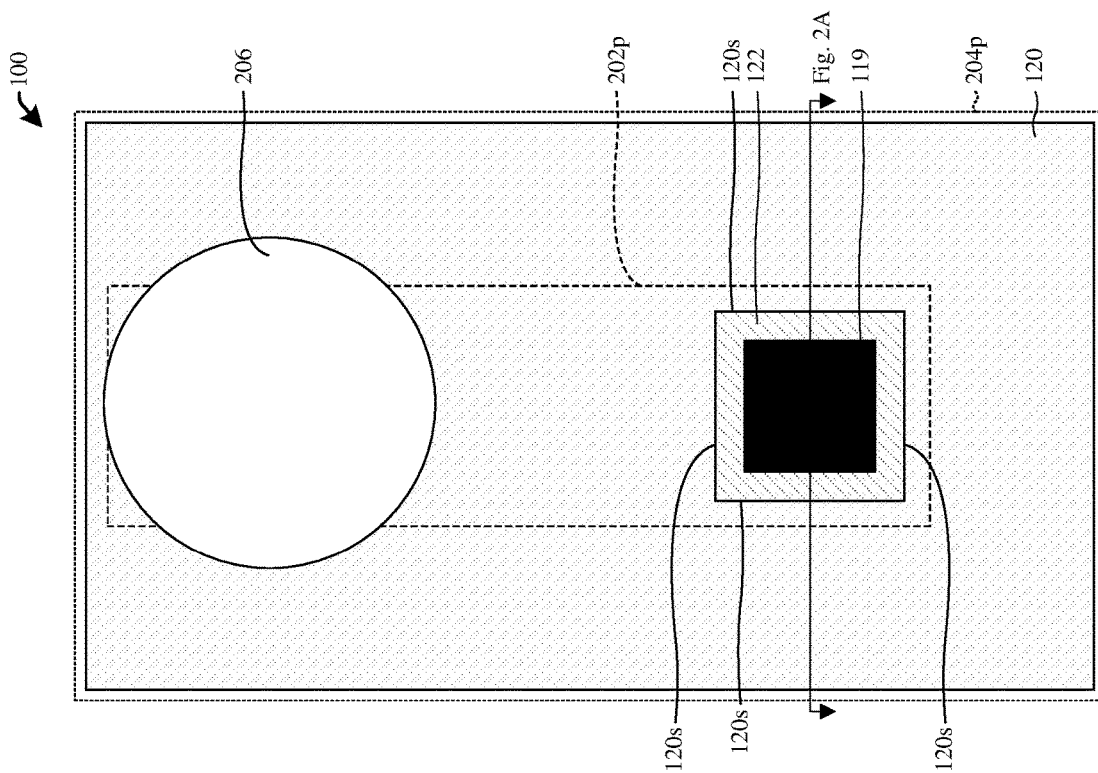
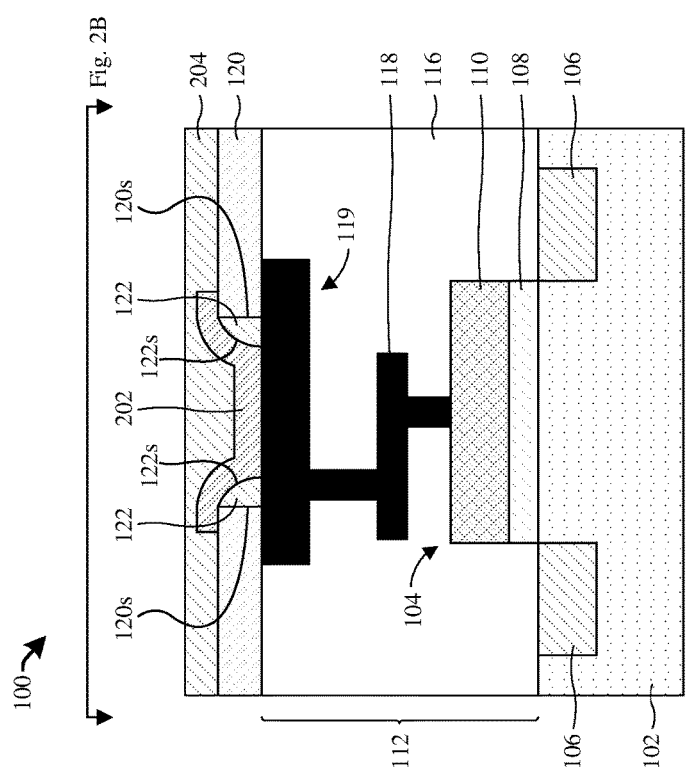

SIDEWALL SPACER TO REDUCE BOND PAD NECKING AND/OR REDISTRIBUTION LAYER NECKING

REFERENCE TO RELATED APPLICATIONS

This Application is a Continuation of U.S. application Ser. No. 17/117,665, filed on Dec. 10, 2020, which is a Continuation of U.S. application Ser. No. 16/416,614, filed on May 20, 2019 (now U.S. Pat. No. 10,879,200, issued on Dec. 29, 2020), which claims the benefit of U.S. Provisional Application No. 62/753,536, filed on Oct. 31, 2018. The contents of the above-referenced Patent Applications are hereby incorporated by reference in their entirety.

BACKGROUND

Modern day integrated chips (ICs) comprise millions or billions of semiconductor devices arranged on/within a semiconductor substrate. The semiconductor devices are connected to a metallization structure comprising an interconnect structure. The interconnect structure comprises a plurality of conductive features (e.g., lines, vias, and contacts) that electrically connect the semiconductor devices to each other. Often the interconnect structure terminates at a bond pad located over the metallization structure. The bond pad may comprise a layer of metal that provides a conductive connection from the integrated chip to external components (e.g., an integrated chip package).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B illustrate various views of some embodiments of an integrated circuit (IC) having a sidewall spacer that reduces redistribution layer (RDL) necking.

DETAILED DESCRIPTION

Figure 1A:
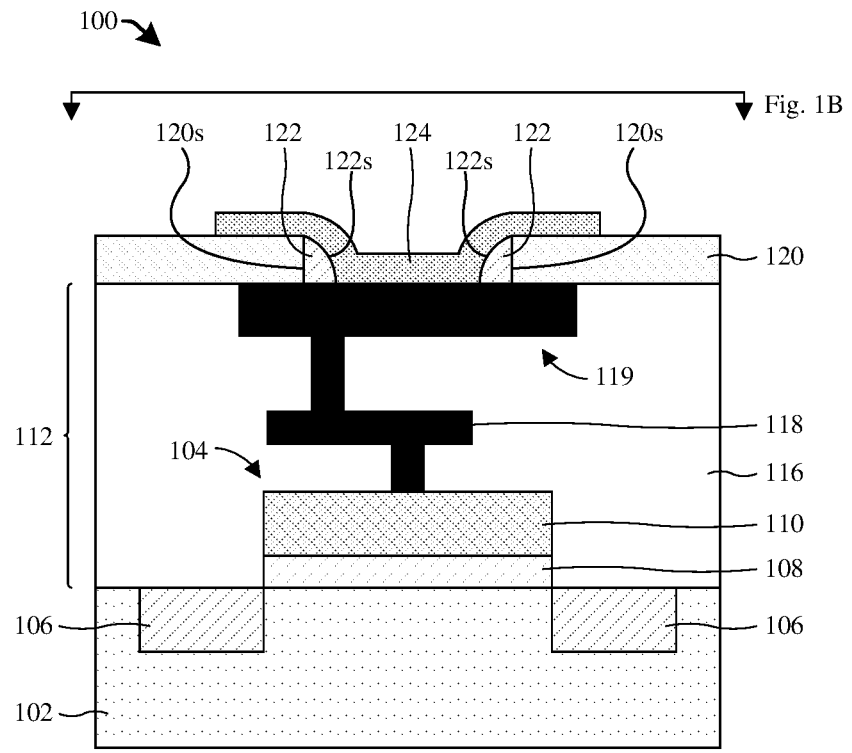
FIGS. 1A-1B illustrate various views of some embodiments of an integrated circuit (IC) having a sidewall spacer that reduces bond pad necking.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips (ICs) comprise a plurality of semiconductor device (e.g., metal-oxide-semiconductor field-effect transistors (MOSFETs)) disposed on/within a semiconductor substrate. A metallization structure is disposed over the semiconductor substrate. The metallization structure comprise an interconnect structure (e.g., a copper interconnect) that electrically couples the plurality of semiconductor devices together. Typically, a passivation layer is disposed over the metallization structure. Bond pads are disposed over the metallization layer and extend through the passivation layer to provide a conductive interface between the interconnect structure and input/output (I/O) structures (e.g., wire bonds, solder bumps, etc.).

One challenge with the above ICs is bond pad necking (and/or redistribution layer (RDL) necking). Bond pad necking (and/or RDL necking) is a reduction in a thickness of the bond pad (and/or RDL) along sidewalls of the passivation layer. For example, a first portion of the bond pad is disposed along sidewalls of the passivation layer and extends through the passivation layer to a second portion of the bond pad that is disposed on a portion of the interconnect structure disposed between the sidewalls of the passivation layer. The first portion of the bond pad may have bond pad necking due to the first portion of the bond pad having a large thickness variation (e.g., the thickness of the first portion of the bond pad being greater near a top of the sidewalls of the passivation layer than near a bottom of the sidewalls of the passivation layer). Because of bond pad necking, subsequent processing of the bond pads (e.g., a cleaning process to strip away a masking layer) may attack the interconnect structure, thereby resulting in damage to the interconnect structure. Accordingly, bond pad necking may negatively affect the performance of the ICs (e.g., increased power consumption, decreased lifecycle, etc.).

In various embodiments, the present application is directed toward an integrated chip (IC). The IC includes a metallization structure disposed over a semiconductor substrate. The metallization structure comprises an interconnect structure disposed in an interlayer dielectric (ILD) structure. A passivation layer is disposed on the metallization structure, where an upper surface of the interconnect structure is at least partially disposed between opposite inner sidewalls of the passivation layer. A sidewall spacer having rounded sidewalls is disposed along the opposite inner sidewalls of the passivation layer. A conductive structure (e.g., a bond pad or redistribution layer (RDL)) is disposed on the passivation layer, the rounded sidewalls of the sidewall spacer, and the upper surface of the interconnect structure.

Because the sidewall spacer has rounded sidewalls and is disposed along the sidewalls of the passivation layer, thickness variations in a portion of the conductive structure that extends along the rounded sidewalls may be reduced. Thus, the sidewall spacer may reduce bond pad necking (and/or RDL necking). Accordingly, the sidewall spacer may prevent damage to the interconnect structure caused by bond pad necking (and/or RDL necking), thereby improving the performance of the IC (e.g., decreased power consumption, increased lifecycle, etc.).

Figure 1B:
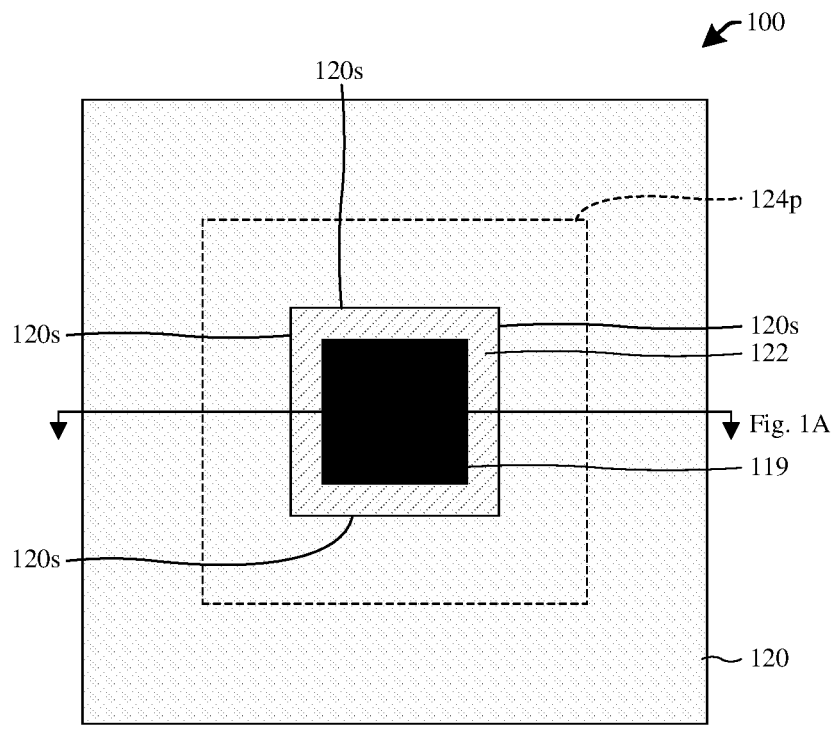

FIGS. 1A-1B illustrate various views of some embodiments of an integrated circuit (IC) 100 having a sidewall spacer 122 that reduces bond pad necking. FIG. 1A illustrates a cross-sectional view of some embodiments of the IC 100 of FIG. 1B. FIG. 1B illustrates a top view of some embodiments of the IC 100 of FIG. 1A with the material of the bond pad 124 (see, infra) removed, such that a perimeter 124p of the bond pad 124 is illustrated by a dotted line.

As shown in FIGS. 1A-1B, the IC 100 comprises a semiconductor substrate 102. In some embodiments, the semiconductor substrate 102 comprises any type of semiconductor body (e.g., monocrystalline silicon/CMOS bulk, silicon-germanium (SiGe), silicon on insulator (SOI), etc.).

A semiconductor device 104 is disposed on/within the semiconductor substrate 102. In some embodiments, the semiconductor device 104 may be a transistor (e.g., a metal-oxide-semiconductor field-effect transistor (MOSFET)). In such embodiments, the semiconductor device 104 comprises a pair of source/drain regions 106 disposed in the semiconductor substrate 102. In further such embodiments, a gate dielectric 108 is disposed on the semiconductor substrate 102 between the source/drain regions 106. In further such embodiments, a gate electrode 110 is disposed on the gate dielectric 108. In yet further embodiments, the semiconductor device 104 may be a high-voltage MOSFET.

A metallization structure 112 is disposed over the semiconductor substrate 102 and the semiconductor device 104. In some embodiments, the metallization structure 112 comprises an interconnect structure 118 disposed in an interlayer dielectric (ILD) structure 116 having one or more ILD layers. The interconnect structure 118 comprises a plurality of conductive elements (e.g., metal lines, metal vias, metal contacts, etc.) configured to electrically couple the semiconductor device 104 to other semiconductor devices (not shown) of the IC 100. In further embodiments, an uppermost conductive element 119 (e.g., an uppermost metal line) of the interconnect structure 118 has an upper surface that is substantially co-planar with an upper surface of the ILD structure 116. In yet further embodiments, the upper surface of the uppermost conductive element 119 may correspond to an upper surface of the interconnect structure 118.

In some embodiments, the interconnect structure 118 may comprise, for example, copper, tungsten, aluminum, some other conductive material, or a combination of the foregoing. In further embodiments, the ILD structure 116 may comprise one or more of, for example, a low-k dielectric layer (e.g., a dielectric with a dielectric constant less than about 3.9), an ultra-low-k dielectric layer, an oxide (e.g., silicon dioxide ($SiO_2$)), some other dielectric material, or a combination of the foregoing.

A passivation layer 120 is disposed over the metallization structure 112. In some embodiments, the passivation layer 120 is disposed on the ILD structure 116 and the uppermost conductive element 119. In further embodiments, the passivation layer 120 comprises first inner sidewalls 120s that extend from the upper surface of the passivation layer 120 to the metallization structure 112. In yet further embodiments, at least a portion of the upper surface of the uppermost conductive element 119 is disposed between the first inner sidewalls 120s.

In some embodiments, the first inner sidewalls 120s may be substantially vertical. In further embodiments, the passivation layer 120 may have a substantially planar upper surface. In yet further embodiments, the passivation layer 120 may comprise, for example, an oxide (e.g., $SiO_2$), a nitride (e.g., silicon nitride (SiN)), an oxy-nitride (e.g., silicon oxy-nitride ($SiO_xN_y$)), some other dielectric material, or a combination of the foregoing. It will be appreciated that, in some embodiments, the passivation layer 120 may comprise one or more dielectric layers.

A sidewall spacer 122 is disposed over the metallization structure 112 and along the first inner sidewalls 120s. In some embodiments, the sidewall spacer 122 is disposed on the upper surface of the uppermost conductive element 119. In other embodiments, the sidewall spacer 122 may be disposed on the upper surface of the ILD structure 116. In further embodiments, the sidewall spacer 122 has rounded sidewalls 122s. In yet further embodiments, opposite rounded sidewalls 122s of the sidewall spacer 122 face one another.

In further embodiments, the sidewall spacer 122 may comprise, for example, an oxide (e.g., $SiO_2$), a nitride (e.g., SiN), an oxy-nitride (e.g., $SiO_xN_y$), some other dielectric material, or a combination of the forgoing. In yet further embodiments, the sidewall spacer 122 may comprise a different material than the passivation layer 120. In other embodiments, the sidewall spacer 122 may comprise a same material as the passivation layer 120.

A bond pad 124 is disposed over the metallization structure 112, the sidewall spacer 122, and the passivation layer 120. In some embodiments, the bond pad 124 is disposed on the uppermost conductive element 119, the rounded sidewalls 122s of the sidewall spacer 122, and the upper surface of the passivation layer 120. In further embodiments, the bond pad 124 is electrically coupled to the interconnect structure 118, and thus electrically coupled to the semiconductor device 104. In yet further embodiments, the bond pad 124 conformally lines the passivation layer 120, the sidewall spacer 122, and the interconnect structure 118.

In some embodiments, the bond pad 124 may comprise, for example, aluminum, copper, aluminum-copper, some other conductive material, or a combination of the forgoing. In further embodiments, the bond pad 124 comprises a different conductive material than the interconnect structure 118. For example, the bond pad 124 may comprise aluminum, and the interconnect structure 118 may comprise copper. In yet further embodiments, the bond pad 124 may comprise a conductive material that the interconnect structure 118 does not comprise.

Because the sidewall spacer 122 is disposed along the first inner sidewalls 120s and because the sidewall spacer 122 has rounded sidewalls 122s, thickness variations in a portion of the bond pad 124 that extends along the rounded sidewalls 122s of the sidewall spacer 122 may be reduced. Thus, the sidewall spacer 122 may reduce bond pack necking. Accordingly, the sidewall spacer 122 may prevent damage to the interconnect structure 118 caused by bond pad necking, thereby improving the performance of the IC 100 (e.g., decreased power consumption, increased lifecycle, etc.).

FIGS. 2A-2B illustrate various views of some embodiments of an integrated circuit (IC) 100 having a sidewall spacer 122 that reduces redistribution layer (RDL) necking. FIG. 2A illustrates a cross-sectional view of some embodiments of the IC 100 of FIG. 2B. FIG. 2B illustrates a top view of some embodiments of the IC 100 of FIG. 2A with the material of the RDL 202 (see, infra) and the material of the capping layer 204 (see, infra) removed, such that a perimeter 202p of the RDL 202 is illustrated by a first dotted line and a perimeter 204p of the capping layer 204 is illustrated by a second dotted line.

As shown in FIGS. 2A-2B, a redistribution layer (RDL) 202 is disposed over the metallization structure 112, the sidewall spacer 122, and the passivation layer 120. In some embodiments, the RDL 202 is disposed on the uppermost conductive element 119, the rounded sidewalls 122s of the sidewall spacer 122, and the upper surface of the passivation layer 120. In yet further embodiments, the RDL 202 conformally lines the passivation layer 120, the sidewall spacer 122, and the interconnect structure 118.

In some embodiments, the RDL 202 is electrically coupled to the interconnect structure 118, and thus electrically coupled to the semiconductor device 104. The RDL 202 is configured to provide an electrical connection between the uppermost conductive element 119 and an input/output (I/O) structure 206 that is disposed at a location spaced from the uppermost conductive element 119. For example, the RDL 202 may extend from the uppermost conductive element 119 across the upper surface of the passivation layer 120 in a lateral direction to a location that is spaced from the uppermost conductive element 119. Accordingly, the I/O structure 206 may be disposed at the location and electrically coupled to the semiconductor device 104 via the RDL 202.

In some embodiments, the I/O structure 206 is disposed on the RDL 202. In other embodiments, the I/O structure 206 is disposed on an under-bump metallization structure (not shown) that is disposed on the RDL 202. In further embodiments, the I/O structure 206 is configured to electrically couple the RDL 202 to external circuitry (e.g., a printed circuit board, an external microprocessor, etc.). In further embodiments, the I/O structure 206 may be, for example, a bump/ball structure, a wire bonding structure, or the like. In yet further embodiments, the I/O structure 206 may comprise, for example, gold (Au), solder, some other conductive material, or a combination of the foregoing.

In some embodiments, the RDL 202 may comprise, for example, aluminum, copper, aluminum-copper, some other conductive material, or a combination of the forgoing. In further embodiments, the RDL 202 comprises a different conductive material than the interconnect structure 118. For example, the RDL 202 may comprise aluminum, and the interconnect structure 118 may comprise copper. In further embodiments, the RDL 202 may comprise a conductive material that the interconnect structure 118 does not comprise. In yet further embodiments, the RDL 202 and/or the bond pad 124 (see, e.g., FIGS. 1A-1B) may be referred to as a conductive structure.

Because the sidewall spacer 122 is disposed along the first inner sidewalls 120s and because the sidewall spacer 122 has rounded sidewalls 122s, thickness variations in a portion of the RDL 202 that extends along the rounded sidewalls 122s of the sidewall spacer 122 may be reduced. Thus, the sidewall spacer 122 may reduce RDL necking. Accordingly, the sidewall spacer 122 may prevent damage to the interconnect structure 118 caused by RDL necking, thereby improving the performance of the IC 100 (e.g., decreased power consumption, increased lifecycle, etc.).

In some embodiments, a capping layer 204 is disposed over the passivation layer 120 and the RDL 202. In such embodiments, the I/O structure 206 extends through the capping layer 204 at the location to contact the RDL 202, such that the I/O structure 206 is electrically coupled to the RDL 202. In further embodiments, the capping layer 204 may have a substantially planar upper surface. In yet further embodiments, the capping layer 204 may comprise, for example, an oxide (e.g., $SiO_2$), a nitride (e.g., SiN), an oxy-nitride (e.g., $SiO_xN_y$), some other dielectric material, or a combination of the foregoing.

Figure 3A:
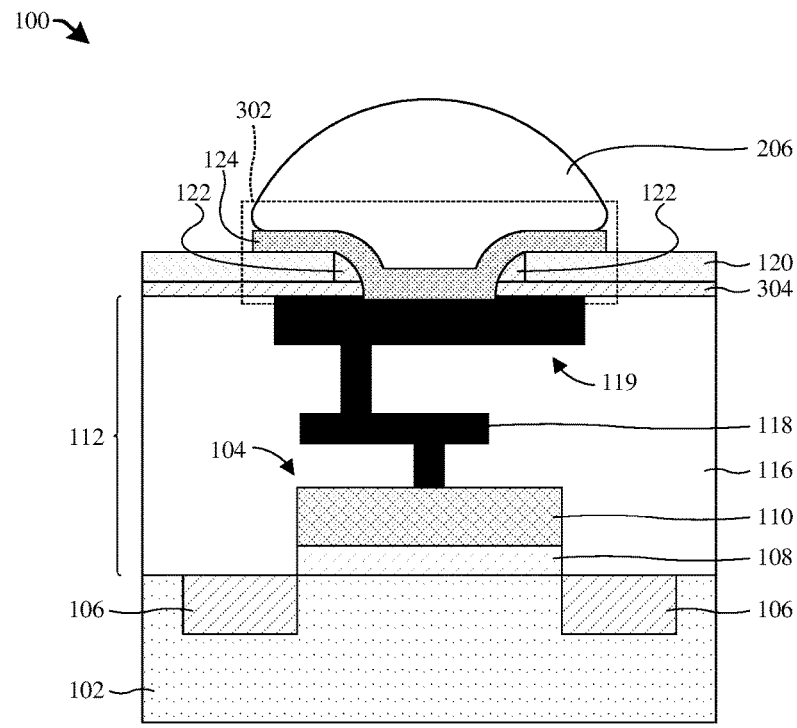
FIGS. 3A-3B illustrate various cross-sectional views of some embodiments of the IC of FIGS. 1A-1B.
Figure 3B:
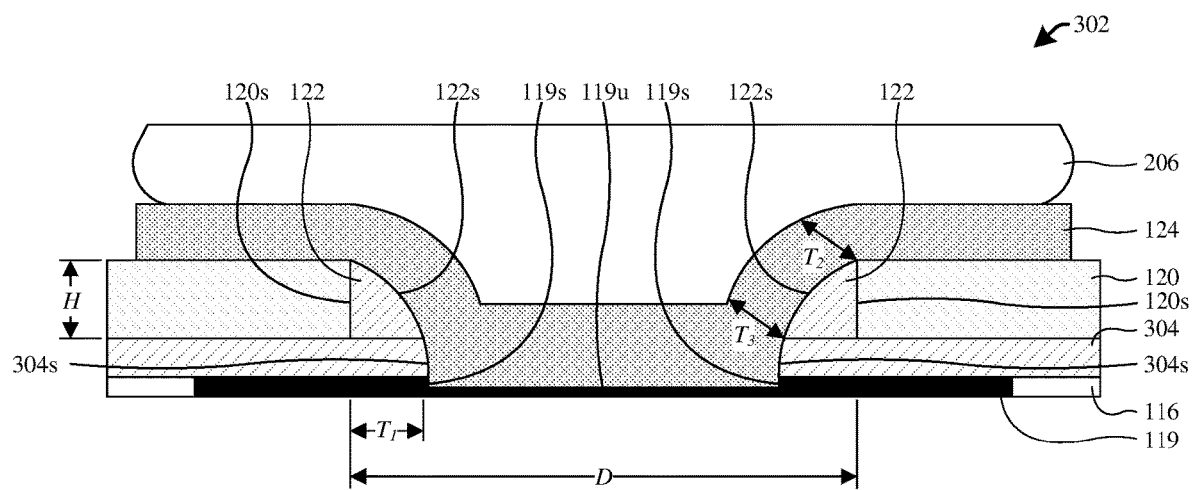

FIGS. 3A-3B illustrate various cross-sectional views of some embodiments of the IC 100 of FIGS. 1A-1B. FIG. 3A illustrates a cross-sectional view of some more detailed embodiments of the IC 100 of FIGS. 1A-1B. FIG. 3B illustrates a magnified cross-sectional view of some embodiments of a region 302 of FIG. 3A. It will be appreciated that, in some embodiments, the IC 100 of FIGS. 2A-2B may comprise substantially similar features as illustrated in FIGS. 3A-3B. For example, in some embodiments, "bond pad 124" may be substituted with "RDL 202" in the following paragraphs describing FIGS. 3A-3B.

As shown in FIGS. 3A-3B, an etch stop layer 304 is disposed between the passivation layer 120 and the metallization structure 112. In some embodiments, the etch stop layer 304 is disposed on the ILD structure 116 and the uppermost conductive element 119. In further embodiments, the passivation layer 120 and the sidewall spacer 122 are disposed on the etch stop layer 304. In such embodiments, the first inner sidewalls 120s may extend from an upper surface of the etch stop layer 304 to the upper surface of the passivation layer 120. In further such embodiments, the rounded sidewalls 122s of the sidewall spacer 122 may extend from the etch stop layer 304 to the passivation layer 120.

In some embodiments, the etch stop layer 304 comprises second inner sidewalls 304s that extend from the uppermost conductive element 119 to the sidewall spacer 122. In further embodiments, at least a portion of the upper surface of the uppermost conductive element 119 is disposed between the second inner sidewalls 304s. In further embodiments, opposite first inner sidewalls 120s are spaced further apart than opposite second inner sidewalls 304s. In further embodiments, the second inner sidewalls 304s are rounded. In other embodiments, the second inner sidewalls 304s may be substantially vertical. In further embodiments, one or more of the second inner sidewalls 304s may extend from the ILD structure 116 to the sidewall spacer 122. In such embodiments, at least a portion of the upper surface of the ILD structure 116 is disposed between the second inner sidewalls 304s.

In some embodiments, the etch stop layer 304 comprises, for example, an oxide (e.g., $SiO_2$), a nitride (e.g., SiN), an oxy-nitride (e.g., $SiO_xN_y$), some other dielectric material, or a combination of the forgoing. In further embodiments, the etch stop layer 304 comprises a different material than the sidewall spacer 122. In further embodiments, the etch stop layer 304 comprises a different material than both the passivation layer 120 and the sidewall spacer 122. In yet further embodiments, a height of the etch stop layer 304 (e.g., between an uppermost surface and a lowermost surface of the etch stop layer 304) may be between about 100 nanometers (nm) and about 200 nm.

In some embodiments, the uppermost conductive element 119 comprises third inner sidewalls 119s that extend from an upper surface 119u of the uppermost conductive element 119 to the etch stop layer 304. In such embodiments, the upper surface 119u of the uppermost conductive element 119 is disposed between an uppermost surface of the uppermost conductive element 119 and a lower surface of the uppermost conductive element 119. In further embodiments, the opposite second inner sidewalls 304s are spaced further apart than opposite third inner sidewalls 119s. In yet further embodiments, the third inner sidewalls 119s are rounded. In other embodiments, the third inner sidewalls 119s may be substantially vertical.

In some embodiments, the third inner sidewalls 119s, the second inner sidewalls 304s, and the rounded sidewalls 122s of the sidewall spacer 122 define common inner sidewalls, respectively, that extend from the uppermost conductive element 119 to the upper surface of the passivation layer 120. In further embodiments, the common sidewalls may have a radius of curvature that is greater than a radius of curvature of the first inner sidewalls 120s. In yet further embodiments, the bond pad 124 continuously extends from the upper surface of passivation layer 120 to the upper surface 119u of the uppermost conductive element 119 by extending along the common sidewalls. In such embodiments, a portion of the bond pad 124 disposed over the passivation layer 120 may have a substantially planar upper surface, a portion of the bond pad 124 disposed along the common sidewalls may have rounded sidewalls, and a portion of the bond pad 124 disposed over the upper surface 119u of the uppermost conductive element 119 may have a substantially planar upper surface.

In some embodiments, the sidewall spacer 122 may have a first thickness $T_1$ that is at least about 40 percent of a height H of the passivation layer 120. In further embodiments, a height of the sidewall spacer 122 may be substantially the same as the height H of the passivation layer 120. In further embodiments, a ratio between the height H of the passivation layer 120 and the first thickness $T_1$ may be, for example, 7 to 3, 6 to 4, or 1 to 1. In further embodiments, the height H of the passivation layer 120 may be between about 200 nm and about 600 nm. In further embodiments, the first thickness $T_1$ may be between about 80 nm and about 600 nm. In yet further embodiments, the rounded sidewalls 122s of the sidewall spacer 122 may have a radius of curvature that is greater than a radius of curvature of the first inner sidewalls 120s.

In some embodiments, a distance D between the opposite first inner sidewalls 120s may be less than or equal to about 3 micrometers (um). In further embodiments, the bond pad 124 may have a second thickness $T_2$ and a third thickness $T_3$. In some embodiments, the second thickness $T_2$ may be between about 100 nm and about 10,000 nm. In further embodiments, the second thickness $T_2$ may be less than or equal to about 300 nm. In further embodiments, the third thickness $T_3$ may be between about 100 nm and about 10,000 nm. In further embodiments, the third thickness $T_3$ may be less than or equal to about 300 nm. In further embodiments, a difference between the second thickness $T_2$ and the third thickness $T_3$ may be plus/minus 20 percent. In further embodiments, the second thickness $T_2$ may be greater than the third thickness $T_3$.

In some embodiments, the I/O structure 206 is disposed on the bond pad 124. In such embodiments, the I/O structure 206 may be disposed directly above the bond pad 124. In further such embodiments, the I/O structure 206 may be disposed directly above the uppermost conductive element 119. In further embodiments, the I/O structure 206 is configured to electrically couple the bond pad 124 to the external circuitry (e.g., a printed circuit board, an external microprocessor, etc.).

FIGS. 4-12 illustrate a series of cross-sectional views of some embodiments for forming the IC 100 of FIGS. 3A-3B.

Figure 4:
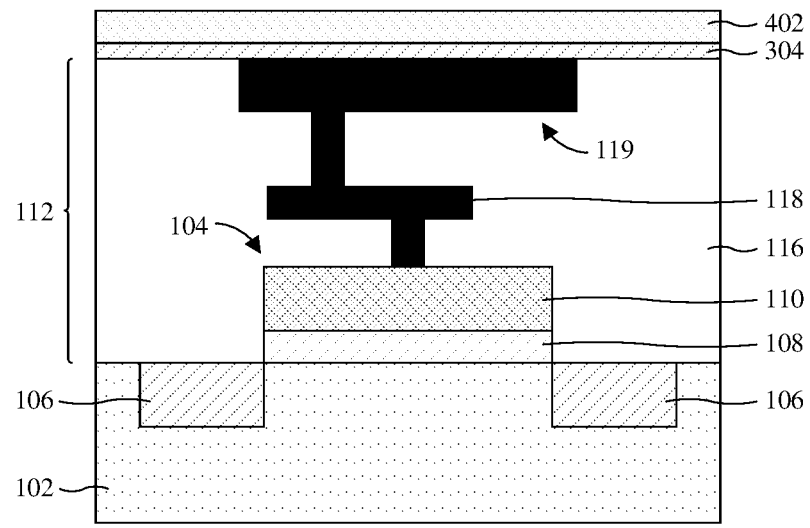
FIGS. 4-12 illustrate a series of cross-sectional views of some embodiments for forming the IC of FIGS. 3A-3B.

As shown in FIG. 4, an etch stop layer 304 is formed over a metallization structure 112. In some embodiments, the metallization structure 112 comprises an interconnect structure 118 disposed in an interlayer dielectric (ILD) structure 116. In further embodiments, an uppermost conductive element 119 (e.g., an uppermost metal line) of the interconnect structure 118 has an upper surface that is substantially co-planar with an upper surface of the ILD structure 116.

In some embodiments, a process for forming the etch stop layer 304 comprises depositing the etch stop layer 304 on the ILD structure 116 and the uppermost conductive element 119. In further embodiments, the etch stop layer 304 may be deposited by, for example, chemical vapor deposition (CVD), physical vapor deposition (PVD), atomic layer deposition (ALD), sputtering, some other deposition process, or a combination of the foregoing.

Also shown in FIG. 4, a first dielectric layer 402 is formed over the etch stop layer 304. In some embodiments, the first dielectric layer 402 may comprise, for example, an oxide (e.g., $SiO_2$), a nitride (e.g., SiN), an oxy-nitride (e.g., $SiO_XN_Y$), some other dielectric material, or a combination of the foregoing. In further embodiments, the first dielectric layer 402 comprises a different dielectric material than the etch stop layer 304.

In some embodiments, a process for forming the first dielectric layer 402 comprises depositing the first dielectric layer 402 on the etch stop layer 304. In further embodiments, the first dielectric layer 402 may be deposited by, for example, CVD, PVD, ALD, sputtering, some other deposition process, or a combination of the foregoing.

Figure 5:
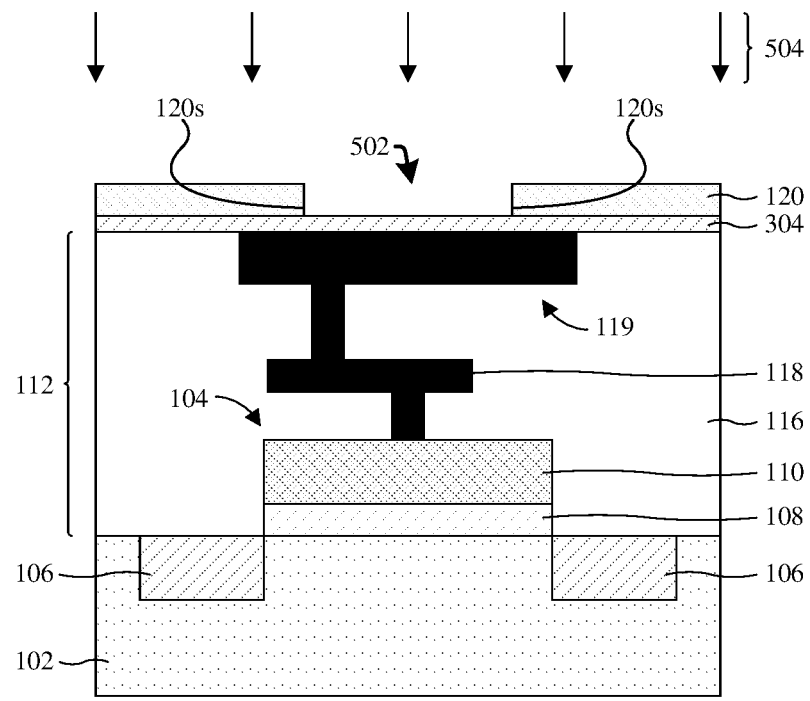

As shown in FIG. 5, a passivation layer 120 is formed over the etch stop layer 304. In some embodiments, a process for forming the passivation layer 120 comprises forming a first opening 502 in the first dielectric layer 402 (see, e.g., FIG. 4). In further embodiments, the first opening 502 is defined by first inner sidewalls 120s of the passivation layer 120 and an upper surface of the etch stop layer 304. In yet further embodiments, opposite sides of the first opening 502 are spaced apart by less than or equal to about 3 um.

In some embodiments, a process for forming the passivation layer 120 comprises depositing a masking layer (not shown) (e.g., a positive/negative photoresist) on the first dielectric layer 402. Thereafter, with the masking layer in place, a first etch 504 (e.g., a wet/dry etch) is performed into the first dielectric layer 402. In some embodiments, the first etch 504 is a dry etch (e.g., reactive-ion etching (RIE)). The first etch 504 forms the first opening 502 in the first dielectric layer 402 by removing unmasked portions of the first dielectric layer 402, thereby forming the passivation layer 120. Subsequently, in some embodiments, the masking layer is stripped away.

Figure 6:
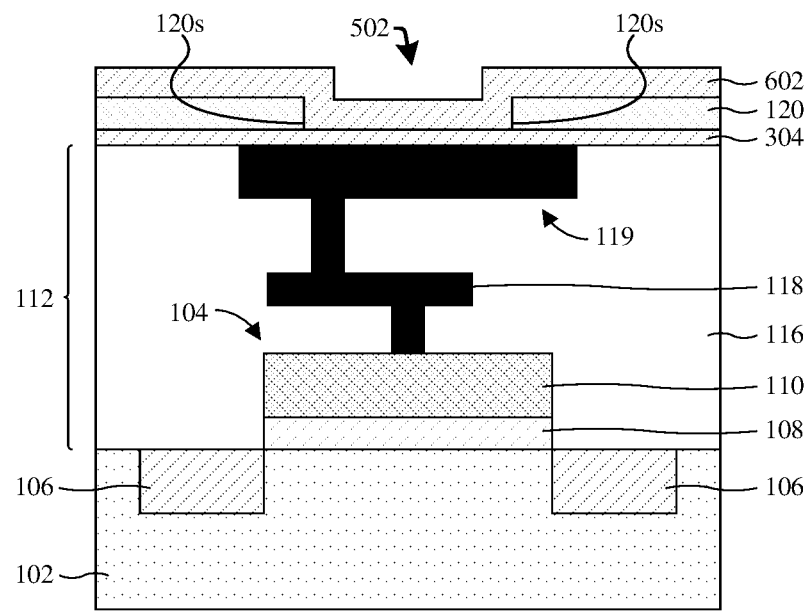

As shown in FIG. 6, a second dielectric layer 602 is formed over the passivation layer 120 and the etch stop layer 304. In some embodiments, the second dielectric layer 602 is formed as a conformal layer lining the first opening 502 and an upper surface of the passivation layer 120. In further embodiments, the second dielectric layer 602 may comprise, for example, an oxide (e.g., $SiO_2$), a nitride (e.g., SiN), an oxy-nitride (e.g., $SiO_XN_Y$), some other dielectric material, or a combination of the foregoing. In further embodiments, the second dielectric layer 602 may comprise a different dielectric material than the etch stop layer 304 and/or the passivation layer 120. In other embodiments, the second dielectric layer 602 may comprise a same dielectric material as the passivation layer 120.

In some embodiments, a process for forming the second dielectric layer 602 comprises depositing the second dielectric layer 602 on the upper surface of the passivation layer 120, the first inner sidewalls 120s, and the upper surface of the etch stop layer 304. In further embodiments, the second dielectric layer 602 may be deposited by, for example, CVD, PVD, ALD, sputtering, some other deposition process, or a combination of the foregoing.

Figure 7:
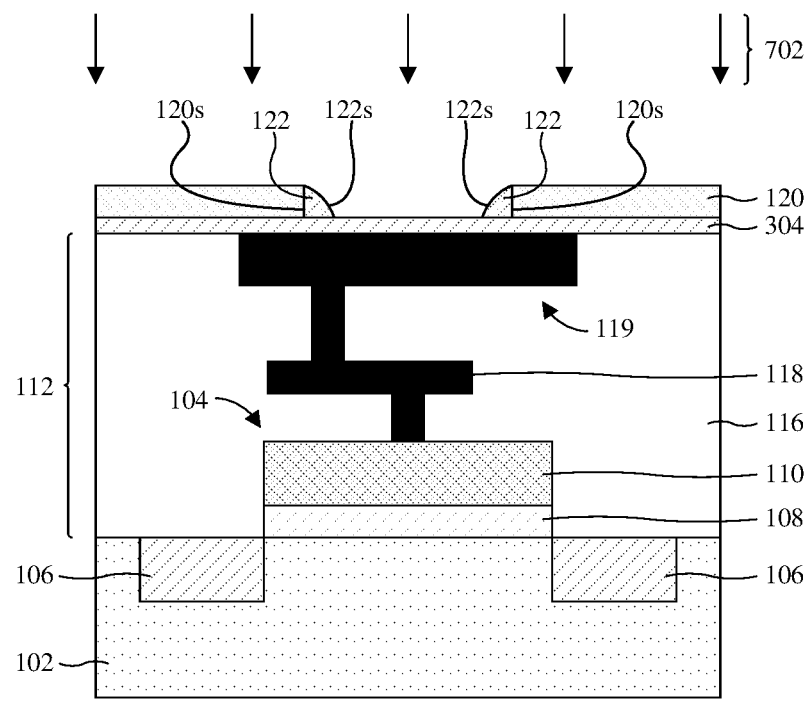

As shown in FIG. 7, a sidewall spacer 122 is formed on the etch stop layer 304 and along the first inner sidewalls 120s. In some embodiments, the sidewall spacer 122 is formed with rounded sidewalls 122s. In further embodiments, a process for forming the sidewall spacer 122 comprises performing a second etch 702 (e.g., a wet/dry etch) into the second dielectric layer 602 (see, e.g., FIG. 6). In some embodiments, the second etch 702 is a dry etch (e.g., RIE). In further embodiments, the second etch 702 removes horizontal segments of the second dielectric layer 602 without removing vertical segments of second dielectric layer 602, thereby forming the sidewall spacer 122.

Figure 8:
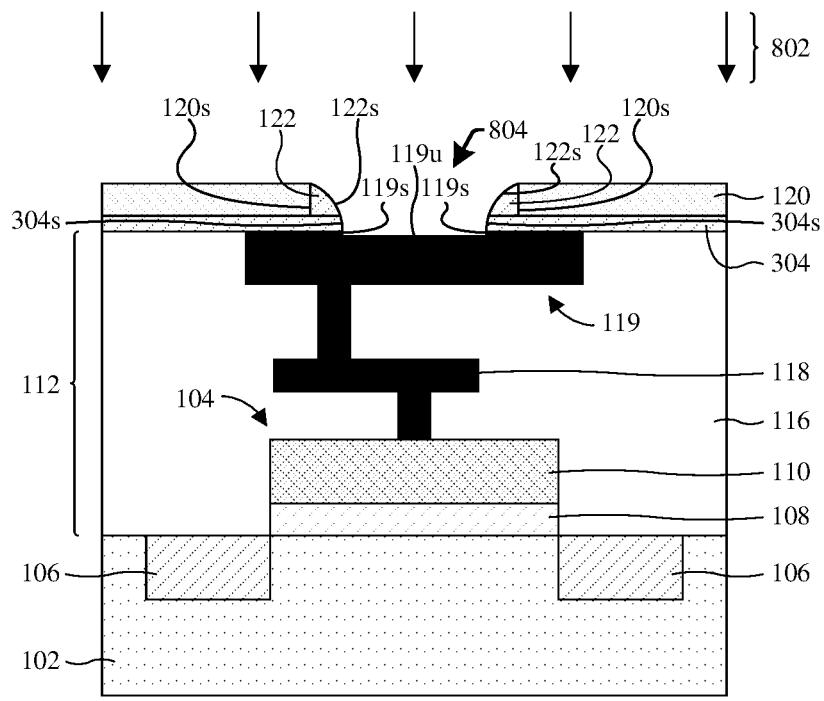

As shown in FIG. 8, a second opening 804 is formed over the uppermost conductive element 119. In some embodiments, the second opening 804 is defined by the rounded sidewalls 122s of the sidewall spacer 122, second inner sidewalls 304s of the etch stop layer 304, third inner sidewalls 119s of the uppermost conductive element 119, and an upper surface 119u of the uppermost conductive element 119.

In some embodiments, a process for forming the second opening 804 comprises depositing a second masking layer (not shown) (e.g., a positive/negative photoresist) on the passivation layer 120 and the sidewall spacer 122. Thereafter, with the masking layer in place, a third etch 802 (e.g., a wet/dry etch) is performed into the etch stop layer 304. In some embodiments, the third etch 802 is a dry etch (e.g., RIE). The third etch 802 removes unmasked portions of the etch stop layer 304, thereby forming the second opening 804. Subsequently, in some embodiments, the masking layer is stripped away. In other embodiments, the third etch 802 may be performed without forming the masking layer. In such other embodiments, the third etch 802 may selectively remove exposed portions of the etch stop layer 304 at a higher rate than exposed portions of the sidewall spacer 122 and/or passivation layer 120.

Figure 9:
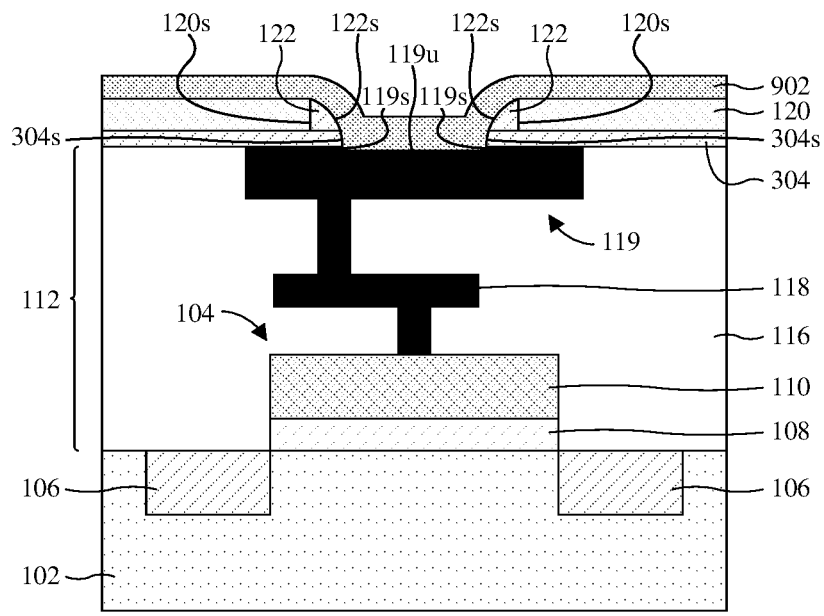

As shown in FIG. 9, a conductive layer 902 is formed over the uppermost conductive element 119, the etch stop layer 304, the sidewall spacer 122, and the passivation layer 120. In some embodiments, the conductive layer 902 is formed as a conformal layer lining the second opening 804 and the upper surface of the passivation layer 120. In further embodiments, the conductive layer 902 may be formed with a thickness (e.g., a distance between an upper surface and a bottom surface of the conductive layer 902) that is less than or equal to about 300 nm. In further embodiments, the conductive layer 902 may comprise, for example, aluminum, copper, aluminum-copper, some other conductive material, or a combination of the forgoing. In further embodiments, the conductive layer 902 comprises a different conductive material than the interconnect structure 118. In yet further embodiments, the conductive layer 902 may comprise a conductive material that the interconnect structure 118 does not comprise.

In some embodiments, a process for forming the conductive layer 902 comprises depositing the conductive layer 902 on the upper surface 119u of the uppermost conductive element 119, the third inner sidewalls 119s, the second inner sidewalls 304s, the rounded sidewalls 122s of the sidewall spacer 122, and the upper surface of the passivation layer 120. In further embodiments, the conductive layer 902 may be deposited by, for example, CVD, PVD, ALD, sputtering, electrochemical plating, electroless plating, some other deposition process, or a combination of the foregoing.

Figure 10:
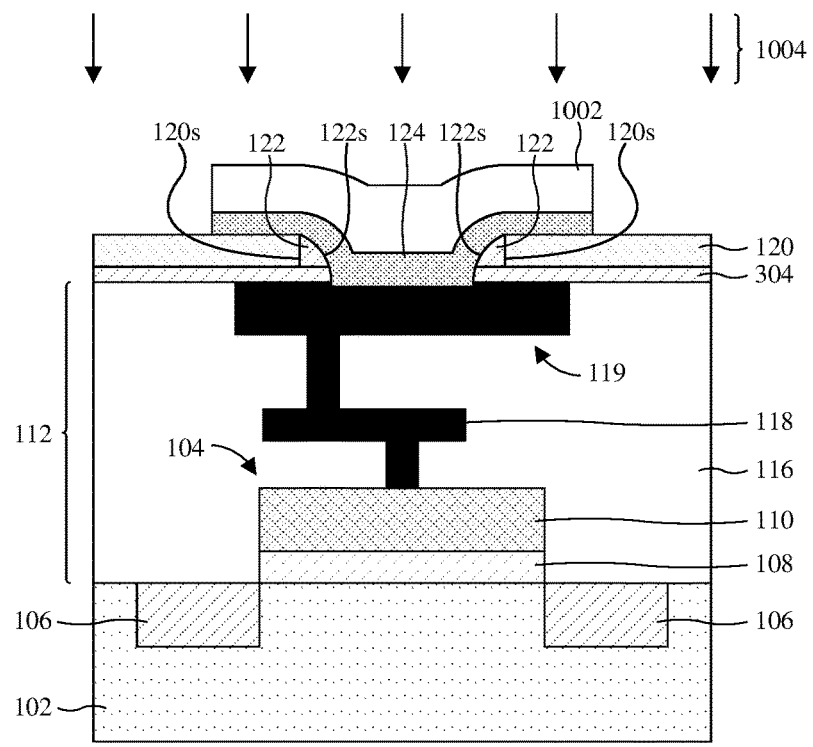

As shown in FIG. 10, a bond pad 124 is formed over the uppermost conductive element 119, the etch stop layer 304, the sidewall spacer 122, and the passivation layer 120. In some embodiments, a process for forming the bond pad 124 comprises forming a masking layer 1002 on the conductive layer 902 (see, e.g., FIG. 9). In some embodiments, a process for forming the masking layer 1002 comprises depositing (e.g., via a spin-on process) a photoresist layer (not shown) on the conductive layer 902. Thereafter, the photoresist layer is selectively exposed to radiation. Subsequently, the photoresist layer is exposed to a developing agent to remove portions of the photoresist layer that were exposed (or not exposed) to the radiation, thereby forming the masking layer 1002.

In some embodiments, with the masking layer 1002 in place, a fourth etch 1004 (e.g., wet/dry etch) is performed into the conductive layer 902. In some embodiments, the fourth etch 1004 is a dry etch (e.g., reactive-ion etching (RIE)). The fourth etch 1004 removes unmasked portions of the conductive layer 902, thereby forming the bond pad 124.

Figure 11:
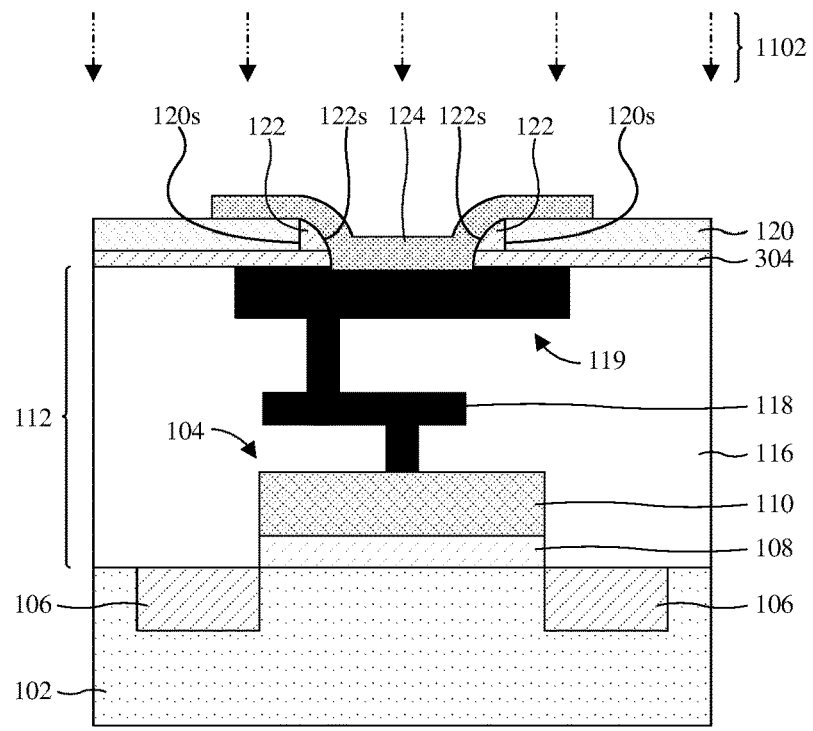

As shown in FIG. 11, the masking layer 1002 (see, e.g., FIG. 10) is removed from the bond pad 124. In some embodiments, a process for removing the masking layer 1002 comprises exposing the masking layer 1002 to a stripping agent 1102. In further embodiments, the stripping agent 1102 is a solvent-based stripping agent. In further embodiments, the masking layer 1002 is exposed to the stripping agent 1102 by submersing the semiconductor substrate 102 (and thus the masking layer 1002) in the stripping agent 1102. In yet further embodiments, after the masking layer 1002 is removed from the bond pad 124, formation of the bond pad is complete.

In some embodiments, the stripping agent 1102 comprises an organic compound (e.g., catechol ($C_6H_6O_2$)). In further embodiments, the stripping agent 1102 may comprise an amine. In further embodiments, the stripping agent 1102 removes the conductive material of the interconnect structure 118 at a faster rate than the conductive material of the bond pad 124. For example, the stripping agent 1102 may remove the conductive material of the interconnect structure at a rate greater than or equal to ten times a rate the striping agent removes the conductive material of the bond pad 124.

Because the sidewall spacer 122 is disposed along the first inner sidewalls 120s and because the sidewall spacer 122 has rounded sidewalls 122s, thickness variations in a portion of the bond pad 124 that extends along the rounded sidewalls 122s of the sidewall spacer 122 may be reduced. Thus, the sidewall spacer 122 may reduce bond pack necking. Accordingly, the bond pad 124 may prevent the interconnect structure 118 from being exposed to the stripping agent 1102, thereby preventing the stripping agent 1102 from damaging the interconnect structure 118 (e.g., undesirably removing portions of the interconnect structure 118).

Figure 12:
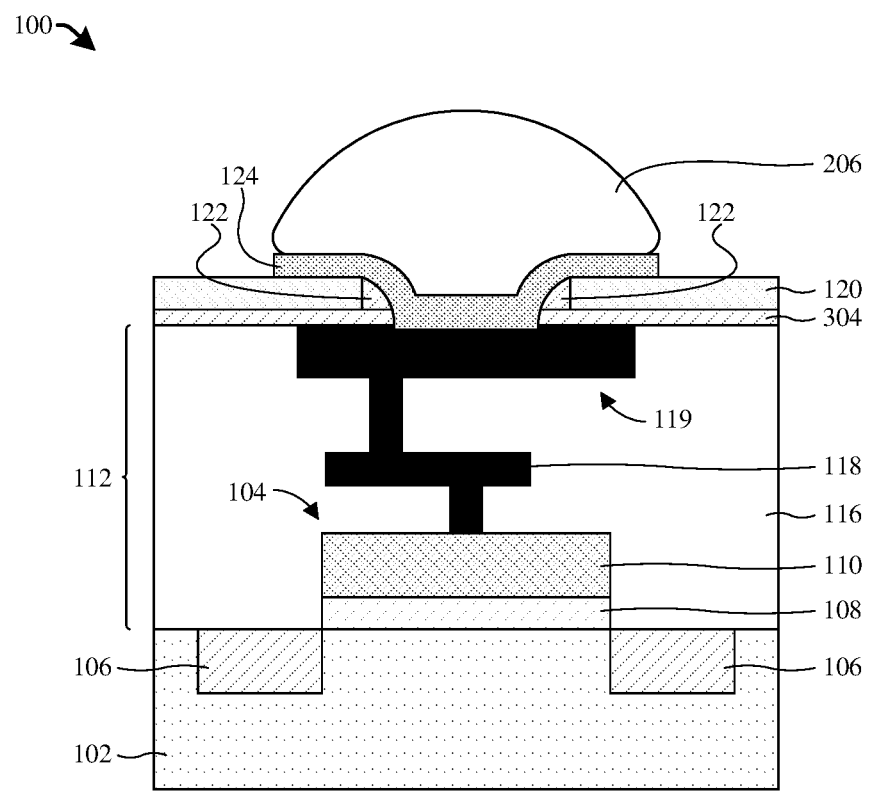

As shown in FIG. 12, an input/output (I/O) structure 206 is formed over the bond pad 124. In some embodiments, forming the I/O structure 206 over the bond pad 124 electrically couples the I/O structure 206 to the interconnect structure 118 via the bond pad 124. In some embodiments, a process for forming the I/O structure 206 comprises depositing a conductive structure (not shown) on the bond pad 124. In further embodiments, the conductive structure may comprise, for example, gold (Au), solder, some other conductive material, or a combination of the foregoing. In further embodiments, the conductive structure may be deposited by, for example, CVD, PVD, ALD, sputtering, electrochemical plating, electroless plating, some other deposition process, or a combination of the foregoing.

Thereafter, a reflow process (e.g., reflow soldering) may be performed on the conductive structure, thereby forming the I/O structure 206. It will be appreciated that, in some embodiments, other process(es) (e.g., wire bonding) may be utilized to form the I/O structure 206. In yet further embodiments, after the I/O structure 206 is formed, formation of the IC 100 is complete.

Figure 13:
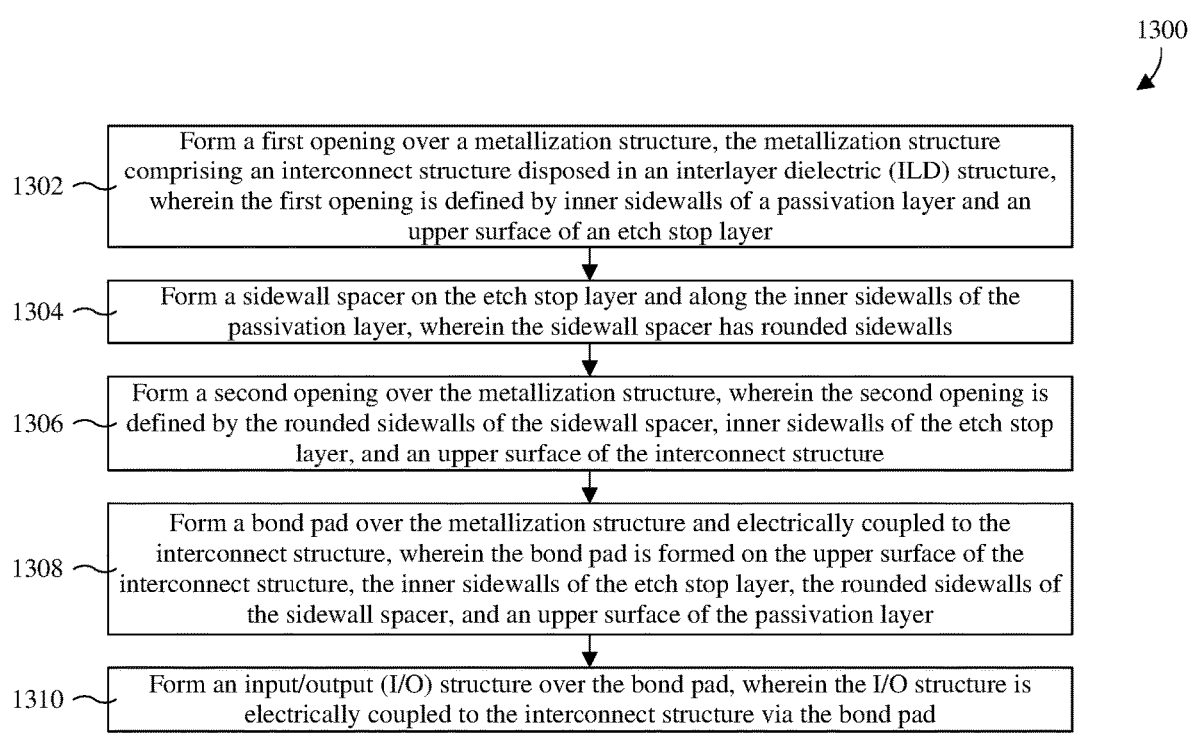
FIG. 13 illustrates a flowchart of some embodiments of a method for forming an integrated circuit (IC) having a sidewall spacer that reduces bond pad necking.

As illustrated in FIG. 13, a flowchart 1300 of some embodiments of a method for forming an integrated circuit (IC) having a sidewall spacer that reduces bond pad necking is provided. It will be appreciated that, in some embodiments, the method provided in flowchart 1300 may be a substantially similar to a method for forming an integrated circuit (IC) having a sidewall spacer that reduces redistribution layer (RDL) necking. While the flowchart 1300 of FIG. 13 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 1302, a first opening is formed over a metallization structure, where the metallization structure comprises an interconnect structure disposed in an interlayer dielectric (ILD) structure. The first opening is defined by inner sidewalls of a passivation layer and an upper surface of an etch stop layer. FIGS. 4-5 illustrate a series of cross-sectional views of some embodiments corresponding to act 1302.

At 1304, a sidewall spacer is formed on the etch stop layer and along the inner sidewalls of the passivation layer, where the sidewall spacer has rounded sidewalls. FIGS. 6-7 illustrate a series of cross-sectional views of some embodiments corresponding to act 1304.

At 1306, a second opening is formed over the metallization structure, where the second opening is defined by the rounded sidewalls of the sidewall spacer, inner sidewalls of the etch stop layer, and an upper surface of the interconnect structure. FIG. 8 illustrates a cross-sectional view of some embodiments corresponding to act 1306.

At 1308, a bond pad is formed over the metallization structure and electrically coupled to the interconnect structure, where the bond pad is formed on the upper surface of the interconnect structure, the inner sidewalls of the etch stop layer, the rounded sidewalls of the sidewall spacer, and an upper surface of the passivation layer. FIGS. 9-11 illustrate a series of cross-sectional views of some embodiments corresponding to act 1308.

At 1310, an input/output (I/O) structure is formed over the bond pad, where the I/O structure is electrically coupled to the interconnect structure via the bond pad. FIG. 12 illustrates a cross-sectional view of some embodiments corresponding to act 1310.

In some embodiments, the present application provides an integrated chip (IC). The IC comprises a semiconductor substrate. A metallization structure is disposed over the semiconductor substrate, where the metallization structure comprises an interconnect structure disposed in an interlayer dielectric (ILD) structure. A passivation layer is disposed over the metallization structure, where an upper surface of the interconnect structure is at least partially disposed between opposite inner sidewalls of the passivation layer. A sidewall spacer is disposed along the opposite inner sidewalls of the passivation layer, where the sidewall spacer has rounded sidewalls. A conductive structure is disposed on the passivation layer, the rounded sidewalls of the sidewall spacer, and the upper surface of the interconnect structure, where the conductive structure is a bond pad and/or a redistribution layer (RDL).

In other embodiments, the present application provides an integrated chip (IC). The IC comprises a semiconductor substrate. A metallization structure is disposed over the semiconductor substrate, where the metallization structure comprises an interconnect structure disposed in an interlayer dielectric (ILD) structure. An etch stop layer is disposed on the metallization structure, where the interconnect structure comprises an uppermost conductive element that is at least partially disposed between opposite inner sidewalls of the etch stop layer. A passivation layer is disposed on the etch stop layer, where the passivation layer comprises opposite inner sidewalls that extend from an upper surface of the etch stop layer to an upper surface of the passivation layer. A sidewall spacer is disposed on the etch stop layer and along the opposite inner sidewalls of the passivation layer, where the sidewall spacer has rounded sidewalls that face one another. A conductive structure is disposed on the uppermost conductive element, the opposite inner sidewalls of the etch stop layer, the rounded sidewalls of the sidewall spacer, and the upper surface of the passivation layer.

In yet other embodiments, the present application provides a method for forming an integrated chip (IC). The method comprises forming a metallization structure over a semiconductor substrate and a semiconductor device on the semiconductor substrate, where the metallization structure comprises an interconnect structure disposed in an interlayer dielectric (ILD) structure. An etch stop layer is formed over the metallization structure. A dielectric layer is formed on the etch stop layer. A part of the dielectric layer is removed to form a passivation layer, where opposite inner sidewalls of the passivation layer define a first opening. A sidewall spacer is formed on the etch stop layer and along the opposite inner sidewalls of the passivation layer, where the sidewall spacer is formed with rounded sidewalls. A part of the etch stop layer is removed to form a second opening that exposes the interconnect structure. A bond pad or redistribution layer is formed contacting the rounded sidewalls, an upper surface of the passivation layer, and the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC), comprising:
a semiconductor substrate;
an interconnect structure disposed over the semiconductor substrate;
a first dielectric layer disposed over the interconnect structure, wherein an upper surface of a conductive feature of the interconnect structure is at least partially disposed between opposite sidewalls of the first dielectric layer;
a sidewall spacer disposed along the opposite sidewalls of the first dielectric layer;
a conductive structure electrically coupled to the conductive feature of the interconnect structure, wherein the conductive structure is disposed over the first dielectric layer, over the sidewall spacer, and over the upper surface of the conductive feature of the interconnect structure; and
a second dielectric layer disposed between the first dielectric layer and the interconnect structure, wherein the conductive structure is disposed along a first sidewall of the second dielectric layer and along a second sidewall of the second dielectric layer, wherein the second sidewall is opposite the first sidewall, wherein the first sidewall and the second sidewall are laterally spaced a first distance apart along a first plane, wherein the first sidewall and the second sidewall are laterally spaced a second distance apart along a second plane, wherein the first plane extends laterally in parallel with the second plane, wherein the first plane is disposed between the second plane and the semiconductor substrate, and wherein the second distance is greater than the first distance.

2. The IC of claim 1, wherein the second plane extends laterally in parallel with an upper surface of the semiconductor substrate.

3. The IC of claim 1, wherein the first dielectric layer comprises a different dielectric material than the second dielectric layer.

4. The IC of claim 1, wherein the second distance is less than or equal to about 3 micrometers.

5. The IC of claim 1, wherein a thickness of the sidewall spacer continuously decreases from a lower portion of the sidewall spacer to an upper portion of the sidewall spacer.

6. The IC of claim 5, wherein the sidewall spacer comprises opposite sidewalls that are disposed along the opposite sidewalls of the first dielectric layer, and wherein the opposite sidewalls of the sidewall spacer extend vertically along a third plane that is transverse the second plane.

7. An integrated chip (IC), comprising:
a semiconductor substrate;
an interconnect structure disposed over the semiconductor substrate;
a first dielectric layer disposed over the interconnect structure, wherein an upper surface of a conductive feature of the interconnect structure is at least partially disposed between opposite sidewalls of the first dielectric layer;
a sidewall spacer disposed along the opposite sidewalls of the first dielectric layer, wherein a thickness of the sidewall spacer continuously decreases from a lower portion of the sidewall spacer to an upper portion of the sidewall spacer;
a conductive structure electrically coupled to the conductive feature of the interconnect structure, wherein the conductive structure is disposed over the first dielectric layer, over the sidewall spacer, and over the upper surface of the conductive feature of the interconnect structure; and
a second dielectric layer disposed between the first dielectric layer and the interconnect structure, wherein the conductive structure is disposed along opposite sidewalls of the second dielectric layer, and wherein the lower portion of the sidewall spacer contacts an upper surface of the second dielectric layer.

8. The IC of claim 7, wherein the lower portion of the sidewall spacer extends continuously laterally from an inner sidewall of the sidewall spacer to an outer sidewall of the sidewall spacer.

9. The IC of claim 7, wherein the conductive structure comprises:
a first portion disposed laterally along the upper surface of the conductive feature of the interconnect structure;
a second portion overlying the first dielectric layer; and
a third portion extending from the first portion to the second portion, wherein the third portion has a first thickness and a second thickness, wherein the second thickness is different than the first thickness, and wherein the second thickness is between about 80 percent and about 120 percent of the first thickness.

10. The IC of claim 9, wherein:
the conductive structure comprises a first portion, a second portion, and a third portion;
the first portion is disposed laterally along the upper surface of the conductive feature of the interconnect structure;
the second portion overlies the first dielectric layer;
the third portion extends from the first portion to the second portion;
the third portion has a first sidewall;
the third portion has a second sidewall opposite the first sidewall of the third portion;
the first sidewall of the third portion and the second sidewall of the third portion are laterally spaced a first distance apart along a first plane;
the first sidewall of the third portion and the second sidewall of the third portion are laterally spaced a second distance apart along a second plane;
the first plane extends laterally in parallel with the second plane;
the first plane is disposed between the second plane and the semiconductor substrate; and
the second distance is greater than the first distance.

11. The IC of claim 10, wherein:
the first sidewall of the third portion extends from an upper surface of the first portion of the conductive structure to an upper surface of the second portion of the conductive structure; and
the second sidewall of the third portion extends from the upper surface of the first portion of the conductive structure to the upper surface of the second portion of the conductive structure.

12. An integrated chip (IC), comprising:
a semiconductor substrate;
an interconnect structure disposed over the semiconductor substrate;
a first dielectric layer disposed over the interconnect structure, wherein an upper surface of a conductive feature of the interconnect structure is at least partially disposed between opposite sidewalls of the first dielectric layer;

a sidewall spacer disposed along the opposite sidewalls of the first dielectric layer;

a conductive structure disposed over the first dielectric layer, the sidewall spacer, and the upper surface of the conductive feature of the interconnect structure; and a second dielectric layer disposed between the first dielectric layer and the interconnect structure, wherein a first sidewall of the second dielectric layer and a first sidewall of the sidewall spacer are substantially aligned and define, at least partially, a first common sidewall, wherein a second sidewall of the second dielectric layer and a second sidewall of the sidewall spacer are substantially aligned and define, at least partially, a second common sidewall, wherein the first common sidewall faces the second common sidewall, wherein the first common sidewall and the second common sidewall are laterally spaced a first distance apart along a first plane, wherein the first common sidewall and the second common sidewall are laterally spaced a second distance apart along a second plane, wherein the first plane extends laterally in parallel with the second plane, wherein the first plane is disposed between the second plane and the semiconductor substrate, wherein the second distance is greater than the first distance, and wherein the conductive structure is disposed along the first common sidewall and the second common sidewall.

13. The IC of claim 12, wherein the second plane extends laterally in parallel with an upper surface of the semiconductor substrate.

14. The IC of claim 13, wherein both the first plane and the second plane are disposed vertically between an upper surface of the second dielectric layer and a lower surface of the second dielectric layer.

15. The IC of claim 13, wherein both the first plane and the second plane are disposed vertically between an upper surface of the first dielectric layer and a lower surface of the first dielectric layer.

16. The IC of claim 13, wherein:
the first plane is disposed vertically between an upper surface of the second dielectric layer and a lower surface of the second dielectric layer; and
the second plane is disposed vertically between an upper surface of the first dielectric layer and a lower surface of the first dielectric layer.

17. The IC of claim 12, wherein:
the first sidewall of the second dielectric layer, the first sidewall of the sidewall spacer, and a first sidewall of the conductive feature of the interconnect structure are substantially aligned and define, at least partially, the first common sidewall; and
the second sidewall of the second dielectric layer, the second sidewall of the sidewall spacer, and a second sidewall of the conductive feature of the interconnect structure are substantially aligned and define, at least partially, the second common sidewall.

18. The IC of claim 17, wherein:
the first plane intersects both the first sidewall of the conductive feature of the interconnect structure and the second sidewall of the conductive feature of the interconnect structure; and
the second plane intersects both the first sidewall of the sidewall spacer and the second sidewall of the sidewall spacer.

19. The IC of claim 12, further comprising:
an input/output (I/O) structure overlying and electrically coupled to the conductive structure, wherein the I/O structure has a first lower surface disposed between a first upper surface of the conductive structure and a second upper surface of the conductive structure, and wherein an upper surface of the first dielectric layer is disposed between the first upper surface of the conductive structure and the second upper surface of the conductive structure.

20. The IC of claim 19, wherein:
a second lower surface of the I/O structure overlies the first upper surface of the conductive structure;
the first upper surface of the conductive structure overlies the first dielectric layer;
a sidewall of the I/O structure extends from the first lower surface of the I/O structure to the second lower surface of the I/O structure; and
the sidewall of the I/O structure conformally lines the first common sidewall.

* * * * *